(12) United States Patent
Odnoblyudov et al.

(10) Patent No.: US 10,483,481 B2
(45) Date of Patent: Nov. 19, 2019

(54) SOLID STATE OPTOELECTRONIC DEVICE WITH PLATED SUPPORT SUBSTRATE

(71) Applicant: Micron Technology, Inc., Boise, ID (US)

(72) Inventors: Vladimir Odnoblyudov, Danville, CA (US); Scott D. Schellhammer, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 225 days.

(21) Appl. No.: 15/298,131

(22) Filed: Oct. 19, 2016

(65) Prior Publication Data

US 2017/0040563 A1    Feb. 9, 2017

Related U.S. Application Data

(63) Continuation of application No. 13/069,162, filed on Mar. 22, 2011, now Pat. No. 9,496,454.

(51) Int. Cl.
| | | |
|---|---|---|
| *H01L 51/52* | (2006.01) | |
| *H01L 33/00* | (2010.01) | |
| *H01L 25/075* | (2006.01) | |
| *H01L 33/06* | (2010.01) | |
| *H01L 33/46* | (2010.01) | |

(Continued)

(52) U.S. Cl.
CPC .......... *H01L 51/52* (2013.01); *H01L 25/0753* (2013.01); *H01L 33/0075* (2013.01); *H01L 33/0095* (2013.01); *H01L 33/06* (2013.01); *H01L 33/46* (2013.01); *H01L 33/62* (2013.01);

*H01L 51/5218* (2013.01); *H01L 33/382* (2013.01); *H01L 2224/32225* (2013.01); *H01L 2224/48091* (2013.01); *H01L 2224/48227* (2013.01); *H01L 2224/73265* (2013.01); *H01L 2933/0016* (2013.01)

(58) Field of Classification Search
None
See application file for complete search history.

(56) References Cited

U.S. PATENT DOCUMENTS

| | | | |
|---|---|---|---|
| 7,378,288 B2 | 5/2008 | Tran et al. | |
| 7,557,367 B2 | 7/2009 | Rogers et al. | |

(Continued)

FOREIGN PATENT DOCUMENTS

| | | |
|---|---|---|
| CN | 101728476 | 6/2010 |
| CN | 101736374 | 6/2010 |

(Continued)

OTHER PUBLICATIONS

English Machine Translation of KR 100691186.*

(Continued)

*Primary Examiner* — Hrayr A Sayadian
(74) *Attorney, Agent, or Firm* — Perkins Coie LLP (57) ABSTRACT

A vertical solid state lighting (SSL) device is disclosed. In one embodiment, the SSL device includes a light emitting structure formed on a growth substrate. Individual SSL devices can include a embedded contact formed on the light emitting structure and a metal substrate plated at a side at least proximate to the embedded contact. The plated substrate has a sufficient thickness to support the light emitting structure without bowing.

13 Claims, 10 Drawing Sheets

(51) Int. Cl.
    *H01L 33/62* (2010.01)
    *H01L 33/38* (2010.01)

(56) References Cited

U.S. PATENT DOCUMENTS

| | | | | |
|---|---|---|---|---|
| 8,440,496 | B2* | 5/2013 | Irvin | H01L 51/0096 257/103 |
| 2005/0056824 | A1 | 3/2005 | Bergmann et al. | |
| 2006/0051937 | A1 | 3/2006 | Ploessl et al. | |
| 2006/0154390 | A1 | 7/2006 | Tran et al. | |
| 2006/0246688 | A1 | 11/2006 | Sekiguchi et al. | |
| 2007/0166851 | A1 | 7/2007 | Tran et al. | |
| 2008/0035949 | A1* | 2/2008 | Fudeta | H01L 33/0079 257/99 |
| 2009/0194154 | A1 | 8/2009 | Takahashi et al. | |
| 2010/0015738 | A1 | 1/2010 | Kim | |
| 2010/0025714 | A1 | 2/2010 | Hsu et al. | |
| 2010/0109035 | A1 | 5/2010 | Cho et al. | |
| 2010/0201280 | A1 | 8/2010 | McKenzie et al. | |
| 2010/0203661 | A1 | 8/2010 | Hodota | |
| 2011/0101502 | A1* | 5/2011 | Wang | C30B 25/02 257/615 |
| 2011/0215366 | A1* | 9/2011 | Tsukagoshi | H01L 33/62 257/99 |
| 2011/0266581 | A1* | 11/2011 | Hsu | H01L 33/0079 257/98 |

FOREIGN PATENT DOCUMENTS

| | | | |
|---|---|---|---|
| JP | 2004095959 | A | 3/2004 |
| JP | 2006012986 | A | 1/2006 |
| JP | 2008066704 | A | 3/2008 |
| JP | 2009206504 | | 9/2009 |
| JP | 2009290068 | A | 12/2009 |
| KR | 100691186 | B1 * | 3/2007 |
| KR | 20070043019 | A | 4/2007 |
| KR | 100752721 | | 8/2007 |
| KR | 20100061130 | | 6/2010 |
| TW | 201007973 | | 2/2010 |
| WO | 2009004980 | A1 | 1/2009 |
| WO | 2009060219 | | 5/2009 |
| WO | 2009148253 | A2 | 12/2009 |

OTHER PUBLICATIONS

Office Action dated Nov. 26, 2014 in Korea Application No. 10-2013-7027674, 15 pages.
Office Action dated Dec. 1, 2015 in Japan Application No. 2014-501255, 8 pages.
Supplementary European Search Report issued Oct. 21, 2014 in European Application No. 12760694, 10 pages.
First Examination Report dated Apr. 1, 2016 in European Application No. 12760694.5, 7 pages.
International Search Report and Written Opinion dated Sep. 24, 2012 in International Application No. PCT/US2012/030188, 7 pages.
Office Action dated May 23, 2014 in Taiwan Application No. 101109963, 11 pages.
Office Action dated Jul. 28, 2015 in China Application No. 201280013917.4, 16 pages.

* cited by examiner

SOLID STATE OPTOELECTRONIC DEVICE WITH PLATED SUPPORT SUBSTRATE

CROSS-REFERENCES TO RELATED APPLICATION

This application is a continuation of U.S. application Ser. No. 13/069,162, filed Mar. 22, 2011, which is incorporated herein by references in its entirety.

TECHNICAL FIELD

The present technology is directed to solid state lighting ("SSL") devices constructed on large diameter wafers (e.g., greater than 4 inches) and with a plated metal support substrate.

BACKGROUND

SSL devices generally use semiconductor light emitting diodes ("LEDs"), organic light emitting diodes ("OLEDs"), and/or polymer light emitting diodes ("PLED") as sources of illumination rather than electrical filaments, a plasma, or a gas. Mobile phones, laptop computers, digital cameras, MP3 players, and other portable electronic devices can utilize SSL devices for background illumination. SSL devices can also be used for signage, indoor lighting, outdoor lighting, and other types of general illumination.

Figure 1:
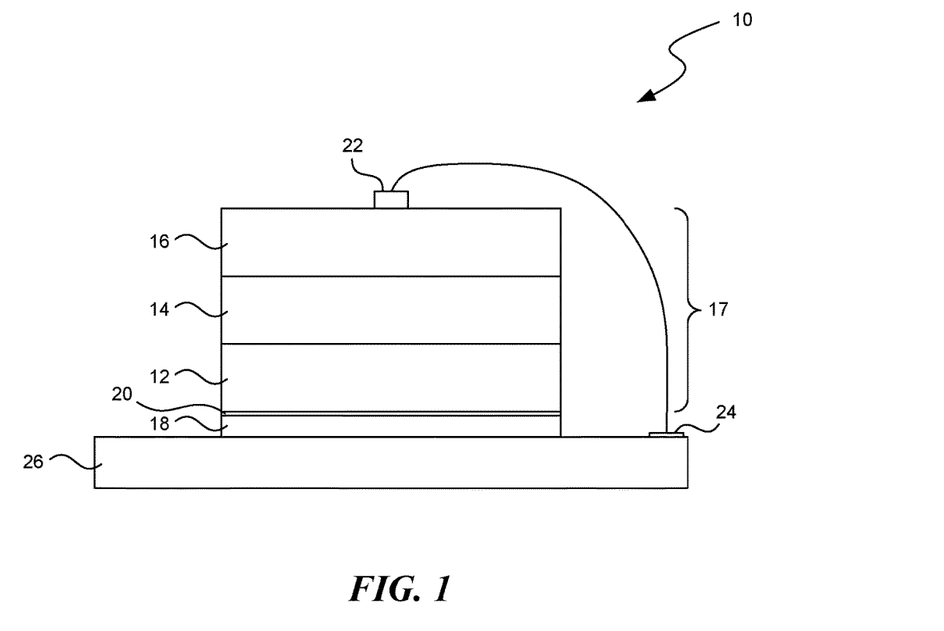
FIG. 1 is an illustration of a vertical SSL device according to the prior art.

FIG. 1 shows a conventional vertical SSL device 10 including a light emitting structure 17 having a p-type gallium nitride (GaN) 12, GaN/indium gallium nitride (In-GaN) multiple quantum wells ("MQWs") 14, and n-type GaN 16 in series. The SSL device 10 also includes a support substrate 18 and a p-type contact 20 between the support substrate 18 and the p-type GaN material 12. Conventional support substrates 18 are typically sapphire or a semiconductor material having a wafer form factor. The SSL device 10 also includes an n-type contact 22 on top of the SSL device 10 that can be wirebonded to an external contact 24 of an external host device 26. As voltage is applied between the n-type contact 22 and the p-type contact 20, electrical current passes through the light emitting structure 17 and produces light. The SSL device 10 can be made on a wafer that is singulated into individual SSL devices.

Conventional devices use thermo-compression bonding, such as copper-copper (Cu—Cu) bonding, to attach the light emitting structure 17 to the support substrate 18. This process requires high temperatures and pressures that can bow or deform the wafer to the extent that it cracks or warps. Currently LED industry is mostly working with 2-4 inch diameter substrates, which limits the throughput and increases costs because fewer SSL devices can be produced on such small wafers. Even at these diameters warp and bow of the wafers is a problem for fabrication of LEDs. This problem becomes severe for large diameter (>4 inch) wafers.

DETAILED DESCRIPTION

Various embodiments of SSL devices, assemblies, and methods of manufacturing are described below. As used hereinafter, the term "SSL device" generally refers to devices with LEDs, laser diodes, OLEDs, PLEDs, and/or other suitable light emitting structures other than electrical filaments, a plasma, or a gas. A person skilled in the relevant art will also understand that the technology may have additional embodiments, and that the technology may be practiced without several of the details of the embodiments described below with reference to FIGS. 2-13.

Figure 2:
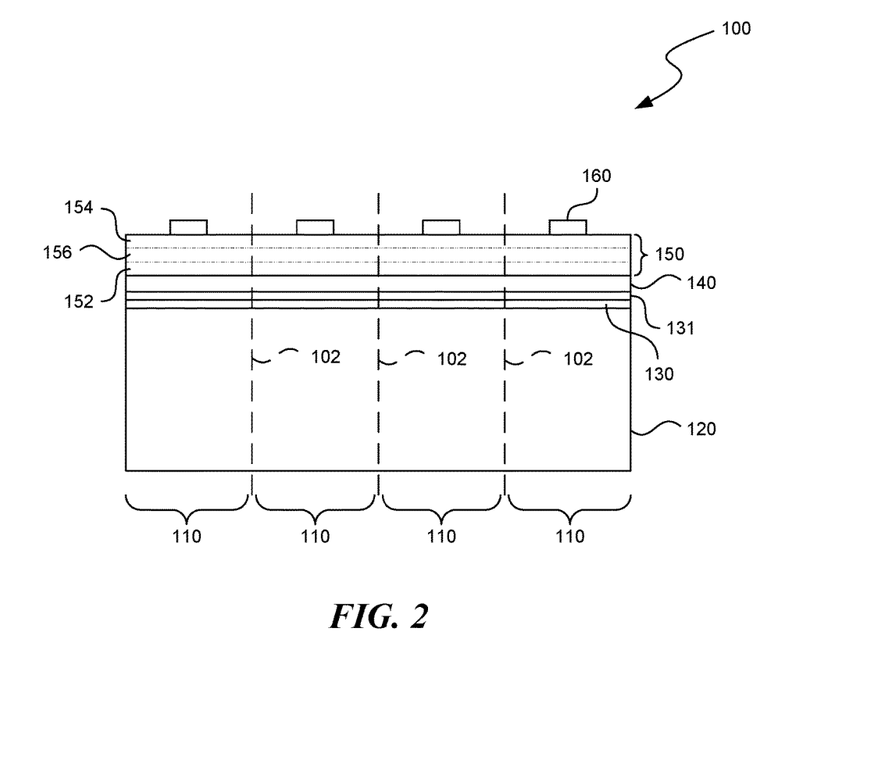
FIG. 2 is a side view of a wafer comprising a plurality of SSL devices according to an embodiment of the present technology.

FIG. 2 illustrates a wafer 100 comprising several light emitting dies 110 formed at the wafer-level according to selected embodiments of the present technology. The wafer 100 can be singulated along dividing lines 102 to create the individual dies 110. In one embodiment, the wafer 100 includes a plated substrate 120, an optional barrier material 130, an optional reflective material 131, an embedded contact 140, a light emitting structure 150, and an exterior contact 160 on the light emitting structure 150. In other embodiments, the embedded contact 140 can be highly reflective and/or provide a barrier to prevent diffusion to/from the lighting structure 150 such that the barrier material 130 and/or reflective material 131 can be omitted.

The plated substrate 120 is at the side of the embedded contact 140 and the plated substrate has a thickness sufficient to inhibit bowing of the light emitting structure 150. For example, when the light emitting structure 150 has a diameter of at least 100 mm (e.g., 100 mm, 150 mm, 200 mm, 300 mm, or more), the plated substrate 120 alone without another carrier or support substrate can inhibit bowing at the center of the wafer 100 to less than about 10 µm-100 mm, or less than about one of 500 µm, 100µm, 50 µm, 20 µm, 10 µm or 5 µm (e.g, 0.001% to 1%).

The plated substrate 120 can be electrically and thermally conductive. For example, the plated substrate 120 can be an elemental metal, an alloy of different metals, or a plurality of non-alloyed metals. In one embodiment, the plated substrate 120 includes copper, a copper alloy, nickel, aluminum, and/or other metals. The properties of different metal or alloy materials, e.g. thickness and composition, could be chosen such that resulting stress from the deposited materials is substantially eliminated and does not result in the wafer warp or bow.

The light emitting structure 150 can be an LED, an OLED, a PLED or other solid state lighting structure including a first semiconductor material 152, a second semiconductor material 154, and an active region 156 between the first semiconductor material 152 and the second semiconductor material 154. For example, the first semiconductor material 152 can be a p-GaN material, the second semiconductor material 154 can be an n-GaN material, and the active region 156 can be a quantum well structure having one or more quantum wells. In several embodiments, the wafer 100 is circular with a diameter of at least four inches, and in many applications the wafer 100 can have a diameter of six inches or more (e.g. between approximately 150-300 mm). FIGS. 3A-14 illustrate several processes, techniques, and methods for producing the dies 110.

Figure 3A:
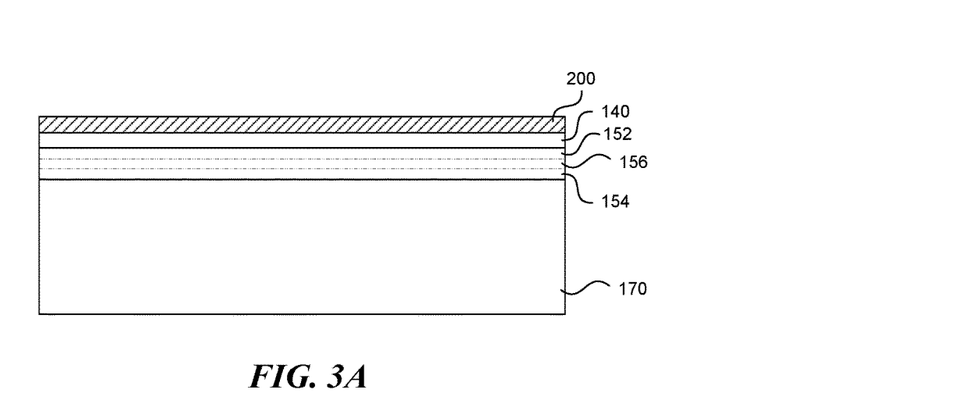
FIG. 3A is a side view of a growth substrate and a light emitting structure according to an embodiment of the present technology.

FIG. 3A illustrates the wafer 100 at a stage of a process according to an embodiment of the present technology after the lighting structure 150 has been formed on a growth substrate 170 apart from the plated substrate 120 shown in FIG. 2. In several embodiments, at least part of the light emitting structure 150 is grown epitaxially on the growth substrate 170. In one embodiment, the growth substrate 170 includes silicon (Si) with a Si(1,1,1) crystal orientation at a surface of the growth substrate 170. In other embodiments, the growth substrate 170 can also include aluminum gallium nitride (AlGaN), GaN, silicon carbide (SiC), sapphire ($Al_2O_3$), an engineered substrate, a combination of the foregoing materials, and/or other suitable substrate materials.

In selected embodiments, the first and second semiconductor materials 152 and 154 include a p-type GaN material and an n-type GaN material, respectively. In another embodiment, the first and second semiconductor materials 152 and 154 include an n-type GaN material and a p-type GaN material, respectively. In further embodiments, the first and second semiconductor materials 152 and 154 can individually include at least one of gallium arsenide (GaAs), aluminum gallium arsenide (AlGaAs), gallium arsenide phosphide (GaAsP), gallium(III) phosphide (GaP), zinc selenide (ZnSe), boron nitride (BN), AlGaN, and/or other suitable semiconductor materials.

The active region 156 can include a single quantum well ("SQW"), multiple quantum wells ("MQWs"), and/or a bulk semiconductor material. As used hereinafter, a "bulk semiconductor material" generally refers to a single grain semiconductor material (e.g., InGaN) with a thickness greater than about 10 nanometers and up to about 500 nanometers.

In certain embodiments, the active region 156 can include an InGaN SQW, InGaN/GaN MQWs, and/or an InGaN bulk material. In other embodiments, the active region 156 can include aluminum gallium indium phosphide (AlGaInP), aluminum gallium indium nitride (AlGaInN), and/or other suitable materials or configurations. In any of the foregoing embodiments, the first semiconductor material 152, the active region 156, the second semiconductor material 154, and any buffer materials (not shown) can be formed on the growth substrate 170 via metal organic chemical vapor deposition ("MOCVD"), molecular beam epitaxy ("MBE"), liquid phase epitaxy ("LPE"), hydride vapor phase epitaxy ("HVPE"), and/or other suitable epitaxial growth techniques.

Figure 3B:
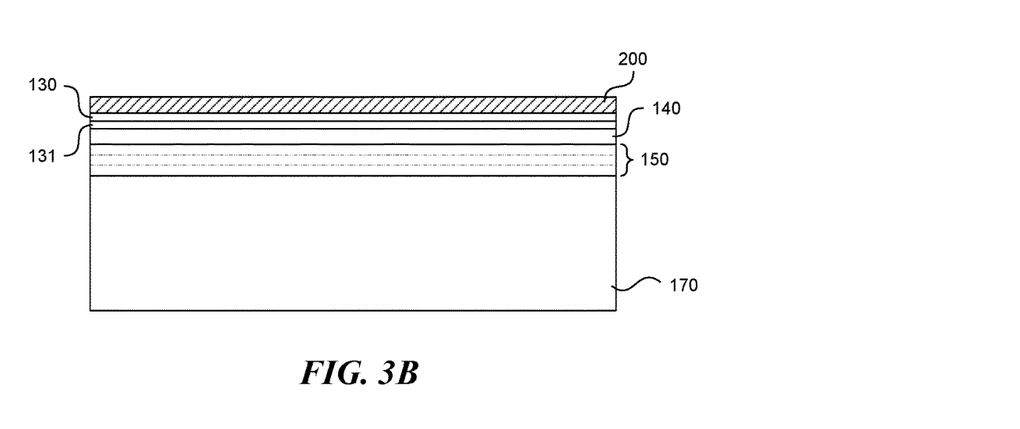
FIG. 3B is a side view of a growth substrate, light emitting structure, barrier material, and reflective material according to an embodiment of the present technology.

The orientation of the light emitting structure 150 in FIGS. 3A and 3B is inverse to what is shown in FIG. 2 because the second semiconductor material 154, active region 156 and first semiconductor material 152 are grown sequentially over the growth substrate 170, and then the embedded contact 140 is formed over the first semiconductor material 152. A metal seed material 200 is formed on the embedded contact material 140. The seed material 200 can be copper or another suitable plating material that is deposited onto the embedded contact material using sputtering, vapor deposition, or other techniques so that it is be relatively thin. The plated metal substrate 120 (FIG. 2) can then be formed at the other side of the light emitting structure 150 proximate the first semiconductor material 152.

FIG. 3B illustrates an alternative embodiment according to the present technology. In addition to the materials described above with reference to FIG. 3A, FIG. 3B includes the barrier material 130 and the reflective material 131. In several embodiments, particularly those in which the seed material 200 comprises copper, the barrier material 130 prevents copper from diffusing into other materials of the stack. The barrier material 130 can be tungsten-titanium (WTi), tantalum nitride, or other suitable materials. The reflective material 131 can be nickel-silver (Ni—Ag), silver (Ag), or other suitable materials. The choice of whether to include the barrier material 130 and/or the reflective material 131 depends on the application for which the dies 110 are designed. For purposes of brevity, the remaining figures do not show the barrier material 130 or the reflective material 131.

Figure 4:
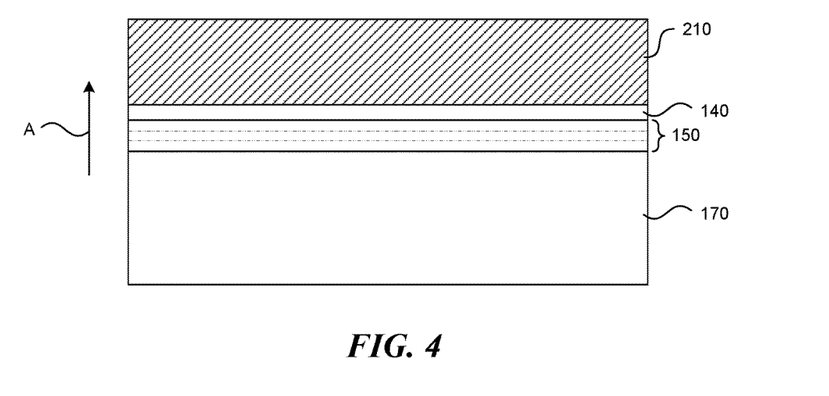
FIG. 4 is a side view of a wafer including a plated substrate according to an embodiment of the present technology.

FIG. 4 illustrates a subsequent stage of an embodiment of the present technology, after a relatively large quantity of supporting bulk metal has been formed monolithically with the seed material. In several embodiments, the bulk metal can be plated on the seed material to form a plated substrate 210 using electroplating or electroless plating. The plated substrate 210 can be sufficient to support the light emitting structure 150 in a manner that inhibits or prevents warping, bowing and cracking. For example, the thickness of the plated substrate 210 can be 50-300 µm, such as 150-300 µm, 100-150 µm or 75-150 µm, and the plated substrate 210 can have a diameter of at least 4 inches (e.g., 6 inches or more). The precise thickness of the plated substrate 210 can depend in part upon the material and dimensions of the light emitting structure 150 and/or the metal of the plated substrate 210. The material of the plated substrate 210 can also efficiently conduct heat away from the light emitting structure 150 and can be an electrical contact for the light emitting structure 150. The plated substrate 210 provides a relatively large contact area that is easy to align with the corresponding electrical contact on a host structure.

Several embodiments of light emitting dies 110 with the plated substrate 210 described above provide several advantages over conventional designs. For example, the plated substrate 210 can prevent bowing of the light emitting structure 150 that can be caused by lateral interior strain between disparate materials of the light emitting structure 150. Such bowing in conventional devices can have many adverse affects, such as lack of uniformity among wafers, difficulty in mounting the singulated dies, delamination between layers, and breakage. Conventional permanent bond processes such as thermo-compression bonding (e.g., Cu—Cu) or temporary liquid phase ("TLP") bonding with inter-metallic compound formation, nickel-tin (NiSn) bonds, tin-copper (SnCu) bonds and tin-silver (SnAg) bonds, are time-consuming and therefore relatively expensive processes. In addition, the thermo-compression bonding process does not work as well on irregular surfaces, whereas plated materials can be readily formed on such surfaces.

Figure 5:
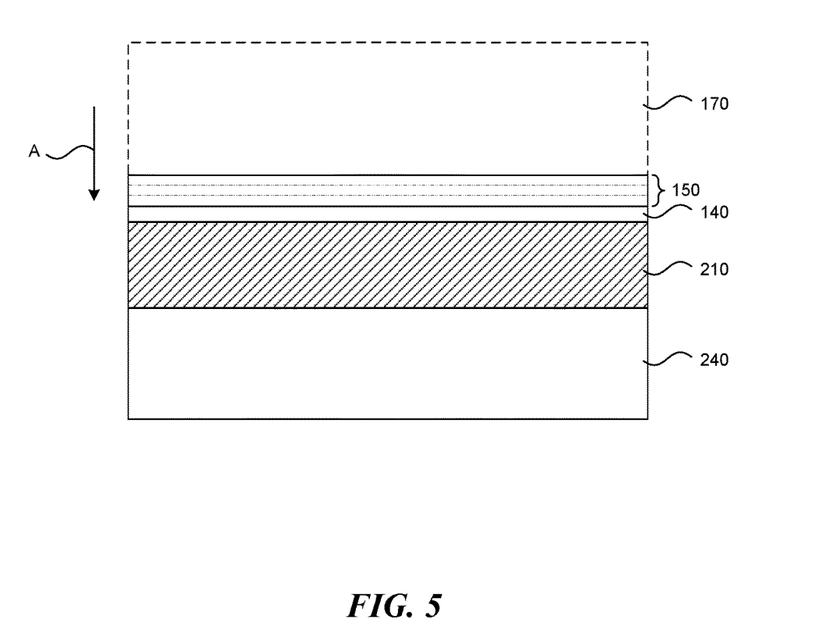
FIG. 5 is a side view of a wafer after the growth substrate has been removed from the light emitting structure according to an embodiment of the present technology.

FIGS. 3A, 3B, and 4 illustrate the wafer 100 in a first orientation in which the growth substrate 170 is shown at the bottom and the plated substrate 210 is shown at the top (as represented by arrow A). FIG. 5 illustrates a subsequent stage of an embodiment of a method of the present technology in which the wafer 100 has been inverted (e.g., arrow A points downward in FIG. 5). The wafer 100 can be mounted to a temporary carrier 240 with a temporary bond. The temporary carrier 240 can be an inexpensive recyclable material, such as silicon or tape. The growth substrate 170 is then removed from the light emitting structure 150 by grinding, etching, or another suitable technique (shown in dashed lines).

Figure 6:
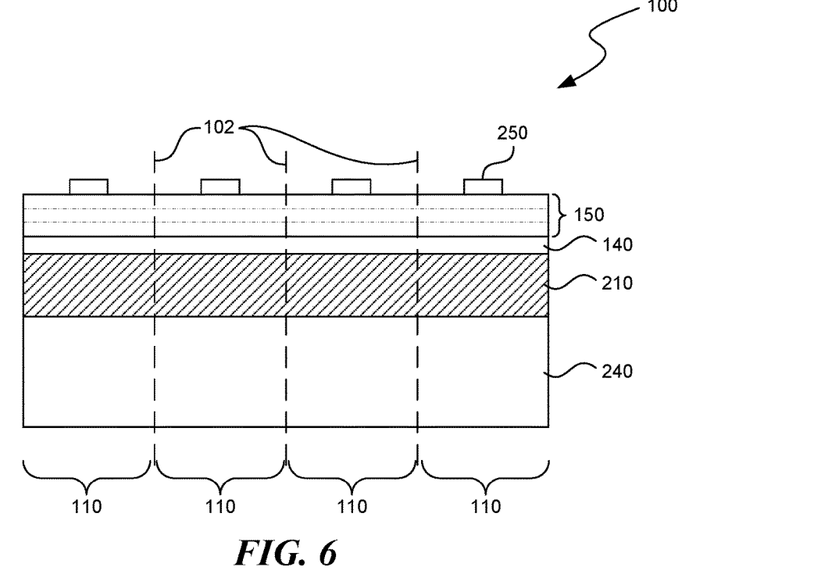
FIG. 6 is a side view of a wafer having n-type contacts and singulation lines according to an embodiment of the present technology.

FIG. 6 shows the wafer 100 after the light emitting structure 150 has been exposed by removing the temporary carrier 240 and after forming several exterior contacts 250 on the wafer 100. The exterior contacts 250 can be formed using conventional metal deposition and patterning techniques. The wafer 100 can also be exposed to a surface-roughening operation. In selected embodiments, each die 110 has one exterior contact 250; in other embodiments, each die 110 has a plurality of exterior contacts 250. The wafer 100 can be annealed at this point, and different configurations can be annealed at different temperatures, such as at a low temperature (less than about 200° C.) or a high temperature (more than about 200° C.). The temporary carrier 240 can survive the relatively low temperatures, but may not survive temperatures above about 200° C. Accordingly, in the low-temperature embodiments the temporary carrier 240 remains on the die 110 through the annealing processes. In high-temperature processes, however, the temporary carrier 240 is removed and the wafer is mounted to a different structure before submitting the wafer to such high temperatures. The dies 110 can be singulated along lines 102 and packaged after forming the exterior contacts 250.

The arrangement of the light emitting structure 150 and the exterior contacts 250 in FIG. 6 is a vertical LED configuration. In several embodiments, the plated substrate 210 is electrically conductive, can be used as an extension of the embedded contact 140, and it can provide a heat sink at the base of the die 110. As such, the die 110 can be mounted to an electrically conductive surface having an electrical bias, and the exterior contact 250 can be wire-bonded to a lead at the opposite bias to complete the circuit. The plated substrate 210 also effectively conducts heat away from the die 110.

Figure 7:
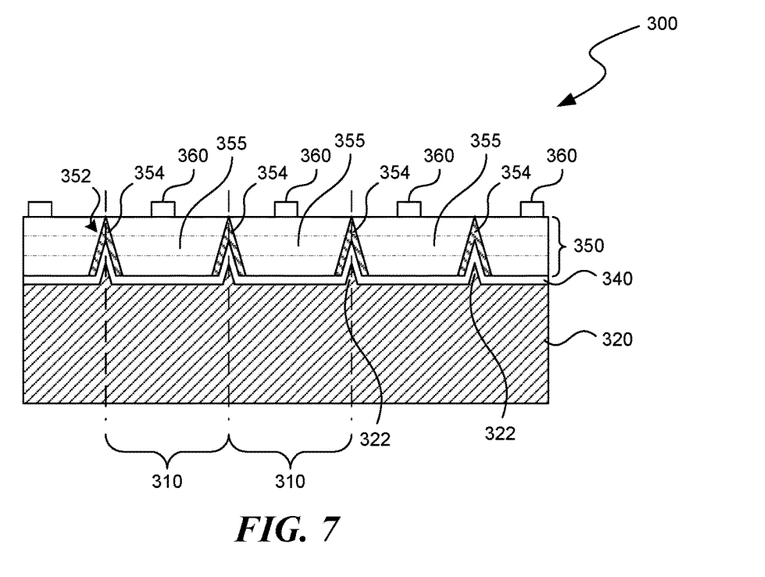
FIG. 7 is a side view of a wafer comprising a plurality of SSL devices having trenches that define mesas according to an embodiment of the present technology.

FIG. 7 shows another embodiment of the wafer 300 including several dies 310 according to the present technology. Many components of this embodiment are similar to aspects of the embodiments described above. The individual dies 310 of the wafer 300 include a plated substrate 320, an embedded contact 340, a light emitting structure 350, and exterior contacts 360. The light emitting structure 350, which can be generally similar to the light emitting structure 10 described above with reference to FIG. 1, can include a first semiconductor material, a second semiconductor material, and an active region. In selected embodiments, the light emitting structure 350 includes trenches 352 separating the light emitting structure 350 into mesas 355. The trenches 352 can be aligned with singulation lines between individual dies 310 and lined with a dielectric liner 354. The plated substrate 320 can be formed to have projections 322 in the trenches 352, and the dielectric liner 354 can insulate the projections 322 from the light emitting structure 350. In several embodiments, the projections 322 are integral with the plated substrate 320.

Figure 8:
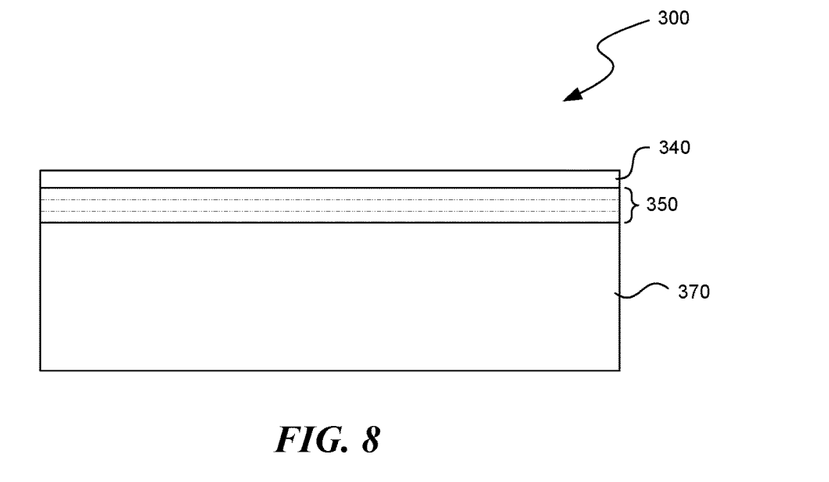
FIG. 8 is a side view of a growth substrate and light emitting structure according to an embodiment of the present technology.

FIG. 8 illustrates the wafer 300 after the light emitting structure 350 and the embedded contact 340 have been formed on a growth substrate 370. Optionally, a barrier and/or reflective material (not shown) can be formed on the growth substrate 370. Aspects of this process are similar to the process described above with reference to FIGS. 3A-6.

Figure 9:
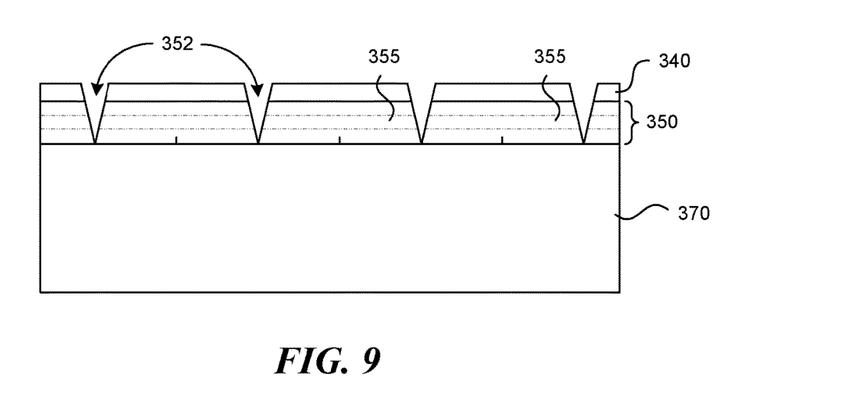
FIG. 9 is a side view of a wafer comprising a growth substrate and light emitting structure including trenches according to an embodiment of the present technology.

FIG. 9 shows an embodiment of a subsequent stage in which the embedded contact 340 and the light emitting structure 350 are etched to form the trenches 352 and the mesas 355. The areas above the mesas 355 can be covered with a mask, and the wafer 300 can be etched, for example via a wet etch, through the exposed portions of the embedded contact material and the light emitting structure 350 to form V-shaped trenches 352. In selected embodiments, the trench 352 can be etched, then dielectric liners 354 can be deposited and patterned. Then the embedded contacts 340 can be deposited and patterned. In several embodiments, the trenches 352 extend completely through the light emitting structure 350 and into the growth substrate 370. In other embodiments, the V-shaped trenches 352 do not reach completely through the light emitting structure 350, leaving a small connecting portion of the light emitting structure 350 at the base of the trench 352. In embodiments in which the individual dies 310 (see FIG. 7) are to be singulated, the singulation procedure can cut through this small connecting portion. The dimensions of the mesas 355 correspond to the final size of the light emitting dies that will be ultimately produced from the wafer 300. The tolerance between the dimensions of the mesas 355 and the final intended size of the light emitting dies can be somewhat large because the wafer 300 is singulated along the trenches. The etching processes described herein can also be performed using dry etch processes.

Figure 10:
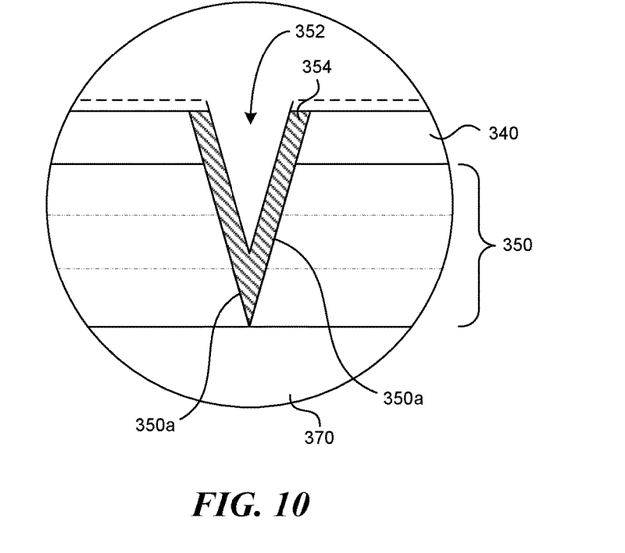
FIG. 10 is an enlarged view of a trench structure according to an embodiment of the present technology.

FIG. 10 is an enlarged view of a single trench 352 according to an embodiment of the present technology. During a wet etch process, the crystal structure of the light emitting structure 350 is preferentially etched at an angle to form angled walls 350a. When the trenches 352 are to be filled with a conductive material, such as a plated metal, the dielectric liners 354 are formed before the trenches 352 are filled. The dielectric liners 354 can be formed by depositing a thin conformal material of dielectric material over all of the exposed surfaces. In selected embodiments, the dielectric material on top of the mesas 355 (shown in dashed lines) can be removed using a mechanical, chemical-mechanical or etching process. In other embodiments, the dielectric material can be deposited after the trenches 352 are etched but before the mask is removed from the wafer 300 such that a portion of the thin dielectric liner 354 remains in the trenches 352 after removing the mask.

Figure 11:
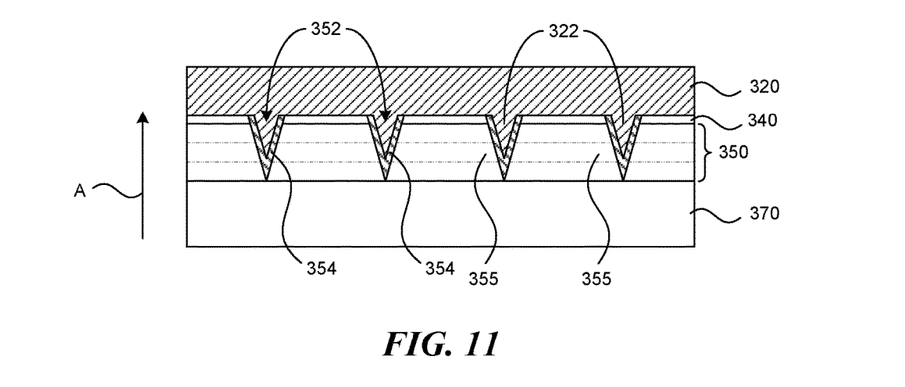
FIG. 11 is a side view of a wafer having a plated substrate according to an embodiment of the present technology.

FIG. 11 illustrates yet another stage of the process for manufacturing the wafer 300 according to an embodiment of the present technology. After forming the trenches 352 and the dielectric liners 354, the material for the embedded contacts 340 can be deposited and the plated substrate 320 can be plated over the light emitting structure 350 and in the trenches 352. In selected embodiments, the contacts 340 can be formed on top of the mesas 355 and not in the trenches 352, as shown in FIG. 11. Alternatively, the contacts 340 can be formed on the mesas 355 and in the trenches 352, as shown in FIG. 7. As described above, in several embodiments a seed material (not shown) can first be deposited over the wafer 300 to facilitate the plating process. The plated substrate 320 can be metal, be thick enough to support the wafer 300, and prevent or at least inhibit bowing. For example, the thickness of the plated substrate 320 can be 50-300 µm, such as 150-300 µm, 100-150 µm or 75-150 µm. This process eliminates the need for thermo-compression or inter-metallic compound bonding, and it allows the wafer 300 to have a larger diameter. In several embodiments, the wafer 300 can be at least four inches in diameter, and in many cases 6-8 inches in diameter without undo bowing.

Figure 12:
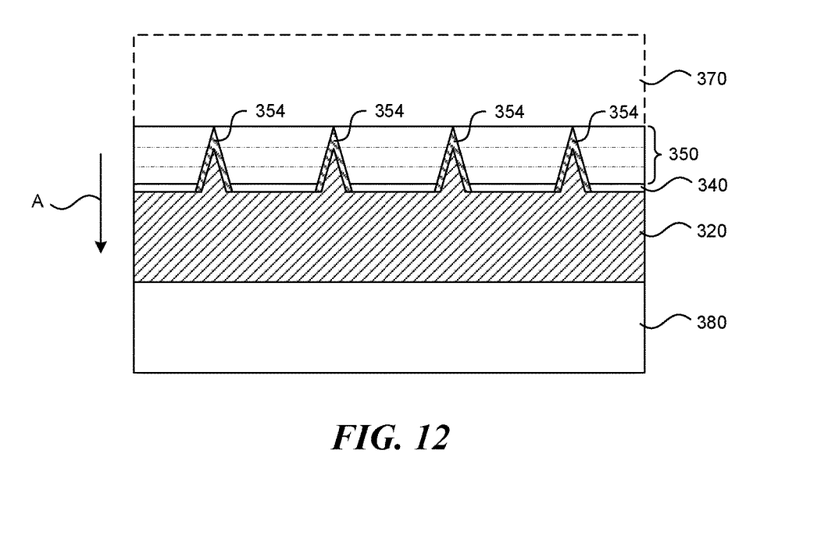
FIG. 12 is a side view of a wafer after the growth substrate has been removed according to an embodiment of the present technology.
Figure 13:
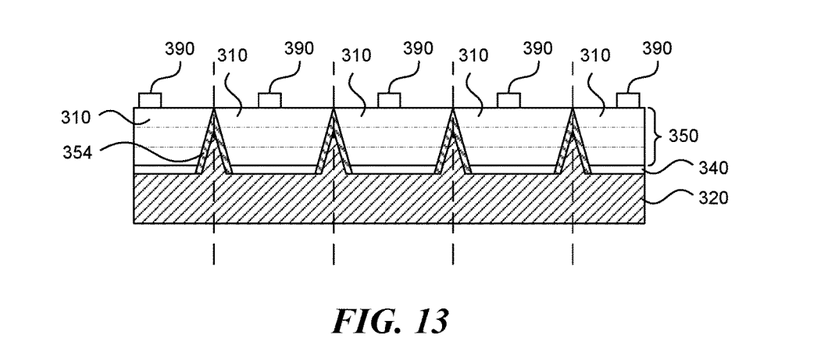
FIG. 13 is a side view of a wafer having exterior contacts and singulation lines between individual SSL devices according to an embodiment of the present technology.

The wafer 300 is oriented with the plated substrate 320 facing the top of FIG. 11, as shown by arrow A. FIG. 12 illustrates another stage of the method after a temporary carrier 380 has been attached to the plated substrate 320, the growth substrate 370 has been removed, and the wafer has been inverted (e.g., see Arrow A). FIG. 13 shows yet another portion of the method according to embodiments of the present technology after exterior contacts 390 have been formed on individual dies 310. As discussed above, the dies 310 can be annealed at a high or low temperature. If the annealing process is performed at a high temperature that would harm the bond line between the temporary carrier 380 and the substrate 320, the temporary carrier 380 can be removed prior to forming the exterior contacts 390. Otherwise, the temporary carrier 380 can remain in place as the exterior contacts 390 are formed.

Figure 14:
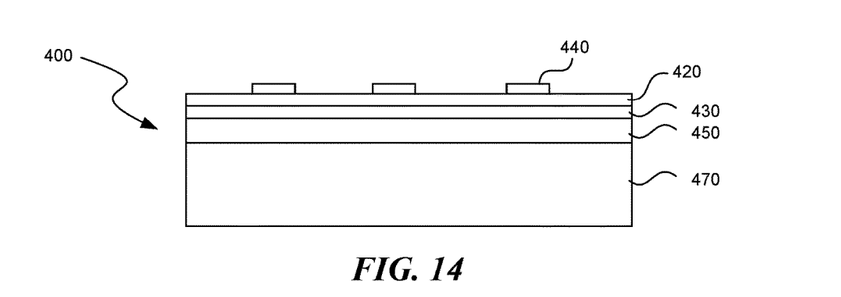
FIG. 14 is a side view of a wafer having a patterned resist according to an embodiment of the present technology.

FIGS. 14-17 illustrate yet another embodiment of the present technology in which a patterned plating is formed on a substrate at an intermediate stage of production of light emitting dies. FIG. 3A and the associated description above relate to an intermediate step in which a seed layer 200 has been formed on an embedded contact 140. In place of (or in addition to) forming the plated substrate 210 on the seed layer, the following structures and processes can be used. FIG. 14 shows a wafer 400 comprising a growth substrate 470, a light emitting structure 450, an optional barrier material 430, and a metal seed layer 420, similar to embodiments described above with reference to FIGS. 1-6. The wafer 400 also includes a patterned resist 440 formed at intervals approximately equal to the size and configuration of the individual dies that will eventually be formed by these processes and singulated into individual SSL devices. In selected embodiments, the patterned resist 440 can align with the planned singulation paths between the dies. In other embodiments, however, the patterned resist 440 can be aligned independently from the singulation paths.

Figure 15:
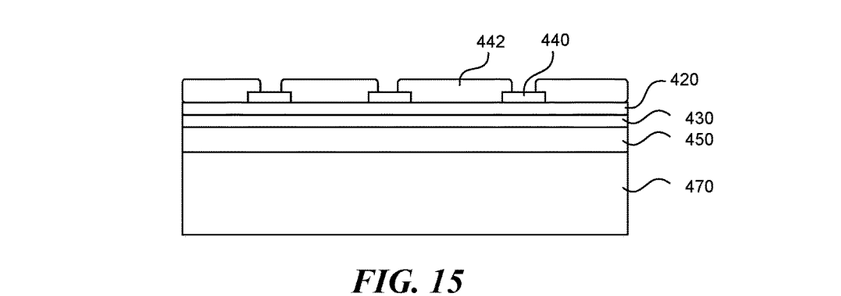
FIG. 15 is a side view of the wafer of FIG. 14 having discrete material portions formed on the wafer according to an embodiment of the present technology.
Figure 16:
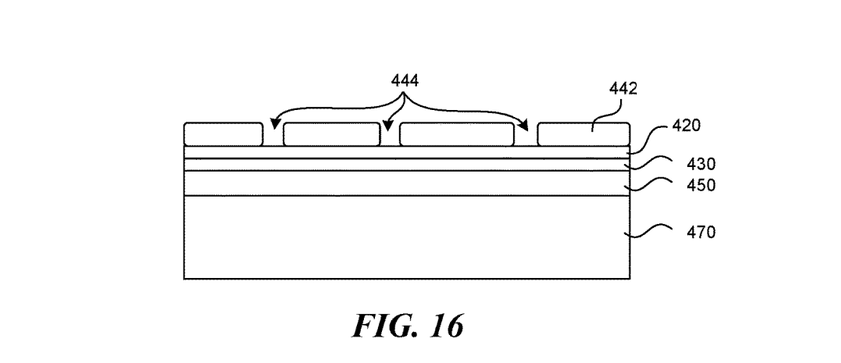
FIG. 16 is a side view of the wafer of FIG. 14 wherein the patterned resist has been removed according to embodiments of the present technology.

FIG. 15 illustrates a further stage in the process according to embodiments of the present technology in which discrete plated material portions 442 are plated using any suitable plating or metal deposition technique. In selected embodiments, the individual discrete material portions 442 are prevented from coalescing with adjacent material portions 442 by the width of the patterned resist 440. In selected embodiments the width of the patterned resist 440 on the wafer 400 is at least approximately twice the thickness of the discrete plated material portions 442. FIG. 16 illustrates a further portion of the process in which the patterned resist 440 is removed, leaving the discrete material portions 442 on the wafer 400 and bonded with the seed material. The resulting structure is a series of discrete plated material portions 442 with streets 444 running between them where the patterned resist 440 once was.

Figure 17:
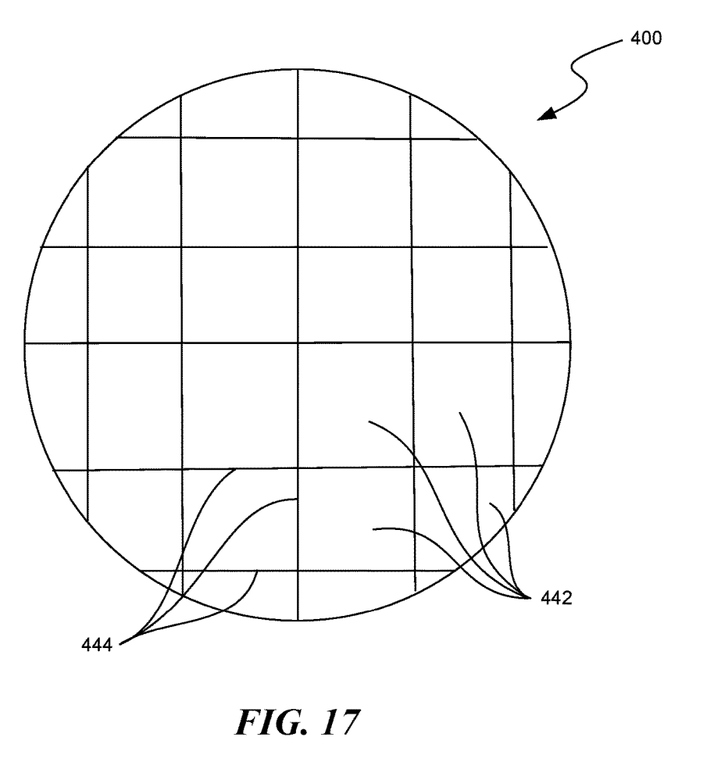
FIG. 17 is a top view of the wafer of FIG. 14 according to embodiments of the present technology.

FIG. 17 is a top view of the discrete material portions 442 and the streets 444 running between them. The streets 444 can be orthogonal as shown, or they can have another suitable orientation. The streets 444 relieve stresses in the wafer 400, and therefore mitigates bowing and deflection of the wafer 400. Using these techniques, the wafer 400 can be a much larger size of six or eight inches or more than with conventional techniques which are generally limited to two or four inches.

The processes described herein are generally applicable to an entire wafer and all of the SSL devices on the wafer. It is to be understood, however, that in several embodiments, one or more of the processes can be localized to a predetermined group of SSL devices, and that not all of the processes need be uniformly applied to the entire wafer.

From the foregoing, it will be appreciated that specific embodiments of the technology have been described herein for purposes of illustration, but that various modifications may be made without deviating from the technology. In addition, many of the elements of one embodiment may be combined with other embodiments in addition to or in lieu of the elements of the other embodiments. Accordingly, the technology is not limited except as by the appended claims.

We claim:

1. A wafer having a plurality of individual solid state lighting devices, comprising:
   a light emitting structure having a first side and a second side opposite the first side, the light emitting structure comprising a first semiconductor material on the first side, a second semiconductor material on the second side, and an active region between the first and second semiconductor materials;
   an embedded contact at the second side;
   a plated substrate formed on the embedded contact, wherein the plated substrate has a thickness sufficient to inhibit bowing of the light emitting structure; and
   a plurality of exterior contacts formed on the first side of the light emitting structure, wherein the wafer is at least approximately 150 millimeters in diameter.

2. The wafer of claim 1 wherein the wafer is between approximately 150-300 millimeters in diameter.

3. The wafer of claim 1 wherein the wafer has trenches in the light emitting structure and the plated substrate comprises a plurality of projections protruding from the plated substrate into the trenches.

4. The wafer of claim 1, further comprising at least one of a barrier material and a reflective material between the plated substrate and the embedded contact.

5. The wafer of claim 1 wherein the plated substrate has a thickness of about 50-300 µm.

6. The wafer of claim 1 wherein the plated substrate has a thickness of about 100-150 µm.

7. The wafer of claim 1 wherein the plated substrate has a thickness greater than a thickness of the light emitting structure.

8. A solid state lighting device, comprising:
   a light emitting structure having a first side and a second side opposite the first side, the light emitting structure comprising a first semiconductor material on the first side, a second semiconductor material on the second side, and an active region between the first and second semiconductor materials;

an embedded contact layer at the second side; and
a thick metal backside support member formed on the embedded contact layer directly connected to an external device, wherein the thick metal backside support member has a thickness sufficient to inhibit bowing of the light emitting structure.

9. The solid state lighting device of claim 8 wherein the embedded contact layer is silver (Ag).

10. The solid state lighting device of claim 8, further comprising a plurality of exterior contacts formed on the first side of the light emitting structure.

11. The solid state lighting device of claim 8 wherein:
the first semiconductor material comprises a p-type gallium nitride ("p-GaN") material;
the second semiconductor material comprises a n-type gallium nitride ("n-GaN") material; and
the active region comprises an indium gallium nitride ("InGaN") material.

12. The solid state lighting device of claim 8 wherein the thick metal backside support member has a thickness of about 50-300 μm.

13. The solid state lighting device of claim 8 wherein the thick metal backside support member has a thickness of about 100-150 μm.

* * * * *